(12) United States Patent
Bando et al.

(10) Patent No.: US 8,658,441 B2
(45) Date of Patent: Feb. 25, 2014

(54) METHOD OF MANUFACTURING NITRIDE SEMICONDUCTOR LIGHT EMITTING ELEMENT

(75) Inventors: Shusaku Bando, Anan (JP); Yasuhiro Miki, Tokushima (JP); Masahiko Onishi, Anan (JP); Hirofumi Nishiyama, Tokushima (JP)

(73) Assignee: Nichia Corporation, Anan-shi (JP)

( * ) Notice: Subject to any disclaimer, the term of this patent is extended or adjusted under 35 U.S.C. 154(b) by 98 days.

(21) Appl. No.: 13/475,901

(22) Filed: May 18, 2012

(65) Prior Publication Data

US 2012/0295373 A1    Nov. 22, 2012

(30) Foreign Application Priority Data

May 19, 2011  (JP) ................. 2011-112625

(51) Int. Cl.
*H01L 21/00*    (2006.01)
(52) U.S. Cl.
USPC .......................................................... 438/22
(58) Field of Classification Search
USPC .......................................................... 438/22
See application file for complete search history.

(56) References Cited

U.S. PATENT DOCUMENTS

| | | | |
|---|---|---|---|
| 7,858,418 B2 | 12/2010 | Watanabe et al. | |
| 8,217,407 B2 | 7/2012 | Watanabe et al. | |
| 2003/0207480 A1 | 11/2003 | Kobayashi et al. | |
| 2004/0266044 A1* | 12/2004 | Park et al. | 438/46 |
| 2008/0128721 A1 | 6/2008 | Watanabe et al. | |
| 2011/0068363 A1 | 3/2011 | Watanabe et al. | |

FOREIGN PATENT DOCUMENTS

| | | |
|---|---|---|
| JP | 04-167569 | 6/1992 |
| JP | 3068914 | 3/2000 |
| JP | 2000-174345 | 6/2000 |
| JP | 2000-307184 | 11/2000 |
| JP | 2000-315819 | 11/2000 |
| JP | 2008-103499 | 5/2008 |

* cited by examiner

*Primary Examiner* — Jae Lee
(74) *Attorney, Agent, or Firm* — Foley & Lardner LLP (57) ABSTRACT

To provide a method of manufacturing a nitride semiconductor light emitting element, which has a small number of steps and thus, can improve productivity, the method of manufacturing a nitride semiconductor light emitting element including a nitride semiconductor light emitting element structure having an n-type nitride semiconductor layer and a p-side nitride semiconductor layer which are laminated on a substrate, an n-side pad electrode connecting surface and a p-side pad electrode connecting surface which are formed on the same plane of the substrate; a n-side pad electrode on the n-side pad electrode connecting surface; and a p-side pad electrode on the p-side pad electrode connecting surface, and in the manufacturing method, a pad electrode layer forming step, a resist pattern forming step, a pad electrode layer etching step, a protective layer forming step and a resist pattern removing step are sequentially performed.

4 Claims, 6 Drawing Sheets

METHOD OF MANUFACTURING NITRIDE SEMICONDUCTOR LIGHT EMITTING ELEMENT

BACKGROUND OF THE INVENTION

1. Field of the Invention

The present invention relates to a method of manufacturing a nitride semiconductor light emitting element in which a surface of the nitride semiconductor light emitting element except for a pad electrode surface is coated with a protective layer.

2. Description of the Related Art

Nitride semiconductors are generally used for light emitting elements such as light emitting diodes (LED) and laser diodes (LD), light receiving elements such as solar cells and light sensors, and electronic devices such as transistors and power devices. Especially, the light emitting diode (nitride semiconductor light emitting element) using the nitride semiconductor has been widely employed in various light sources for backlight, illumination, traffic signals, large displays and the like.

The nitride semiconductor light emitting element is formed by providing a translucent p-side whole surface electrode for uniformly diffusing a current on a p-side nitride semiconductor layer to improve an output, forming a pad electrode for wire bonding, which is made of a metal material, on the translucent p-side whole surface electrode and coating the surface except for the surface of the wire-bonded pad electrode with an insulating protective layer.

For example, JP-A-2000-174345 (refer to a paragraph 0004 and FIG. 8) describes that the pad electrode and the protective layer in such nitride semiconductor light emitting element are formed in independent different steps.

Figure 5:
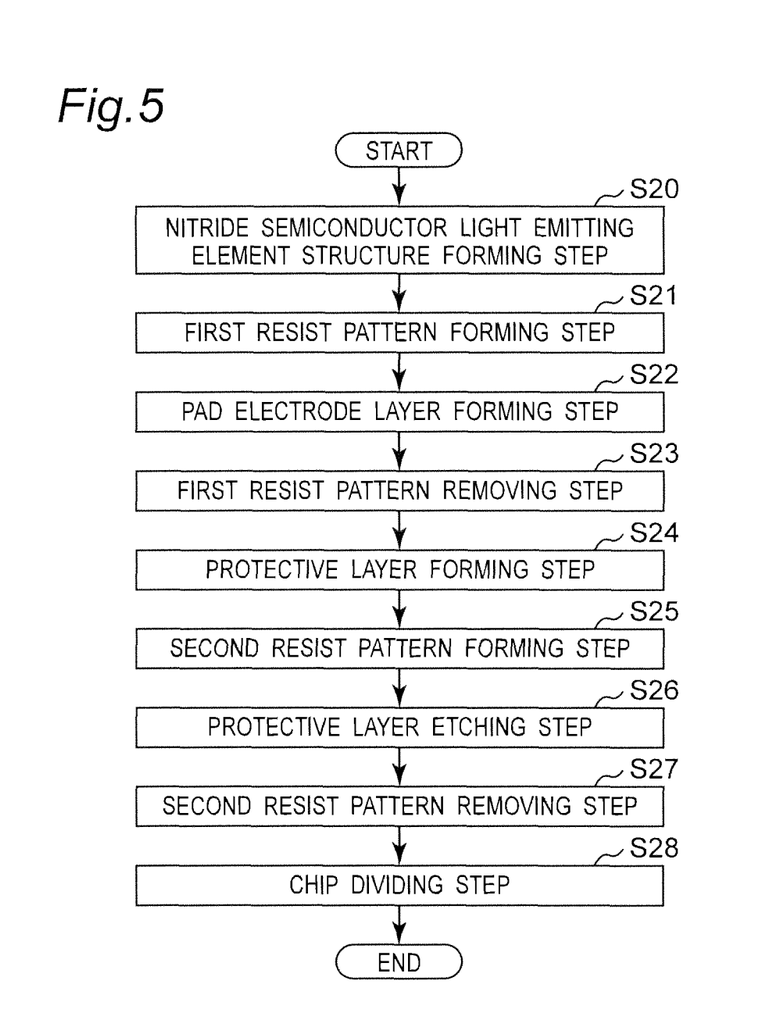
FIG. 5 is a flow chart showing a flow of a method of manufacturing a nitride semiconductor light emitting element according to the prior art.
Figure 6A:
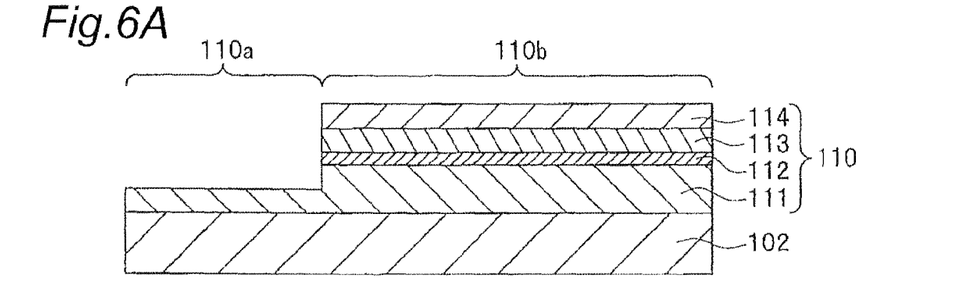
FIG. 6A shows a state where the nitride semiconductor light emitting element structure is formed.
Figure 6B:
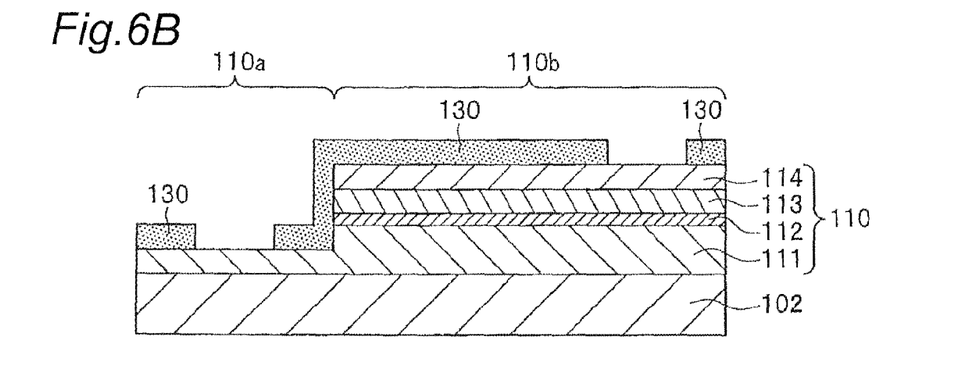
FIG. 6B shows a state where a first resist pattern for forming the pad electrode is formed.
Figure 6C:
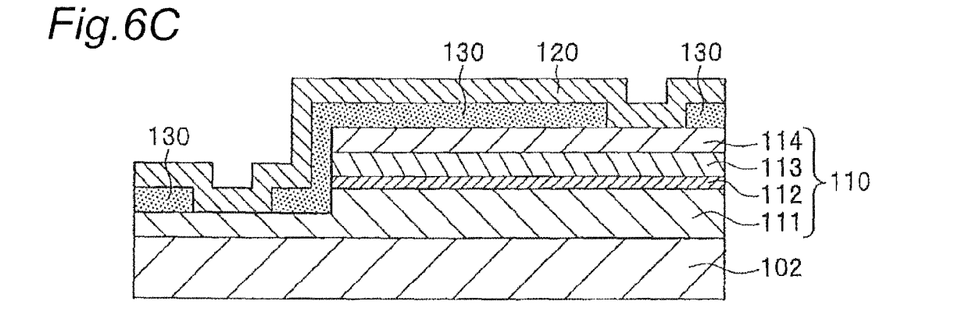
FIG. 6C shows a state where the pad electrode layer is formed and FIG. 6D shows a state where the first resist pattern is removed.
Figure 6D:
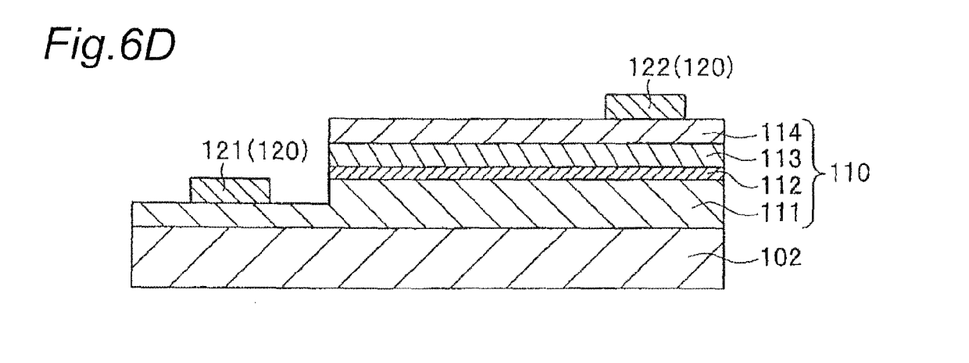
Figure 7A:
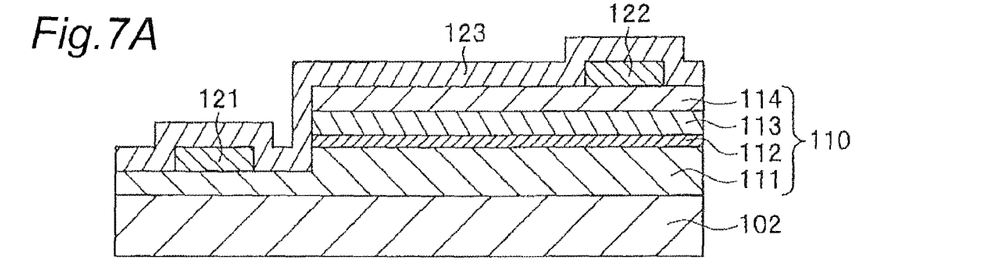
FIG. 7A shows a state where the protective layer is formed.
Figure 7B:
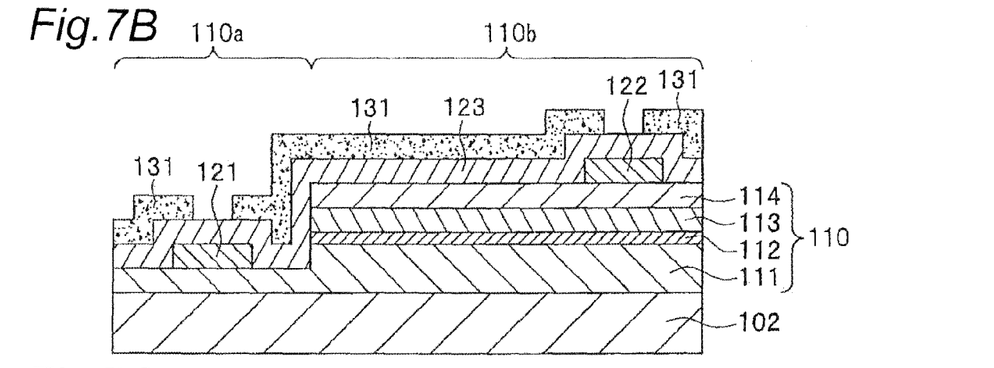
FIG. 7B shows a state where a second resist pattern for exposing an electrode surface of the pad electrode is formed.
Figure 7C:
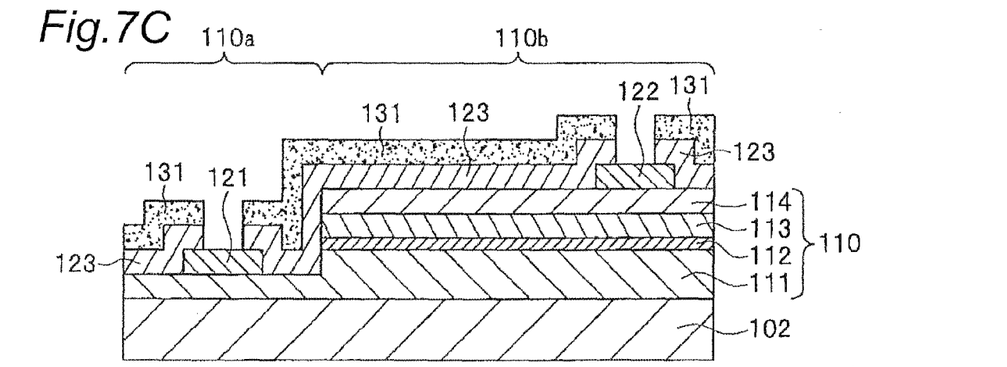
FIG. 7C shows a state where the electrode surface of the pad electrode is exposed and FIG. 7D shows a state where the second resist pattern is removed.
Figure 7D:
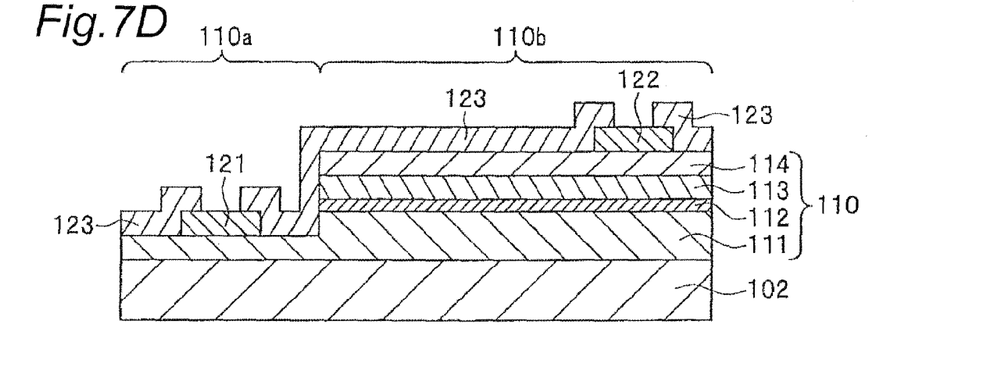

The method of manufacturing a nitride semiconductor light emitting element according to the prior art will be described with reference to FIG. 5 to FIG. 7. FIG. 5 is a flow chart showing a flow of the method of manufacturing a nitride semiconductor light emitting element according to the prior art. FIG. 6 and FIG. 7 are schematic sectional views for describing the method of manufacturing a nitride semiconductor light emitting element according to the prior art, FIG. 6A shows a state where the nitride semiconductor light emitting element is formed, FIG. 6B shows a state where a first resist pattern for forming the pad electrode is formed, FIG. 6C shows a state where a pad electrode layer is formed, FIG. 6D shows a state where the first resist pattern is removed, FIG. 7A shows a state where the protective layer is formed, FIG. 7B shows a state where a second resist pattern for exposing an electrode surface of the pad electrode is formed, FIG. 7C shows a state where the electrode surface of the pad electrode is exposed and FIG. 7D shows a state where the second resist pattern is removed.

In the method of manufacturing a nitride semiconductor light emitting element according to the prior art, as shown in FIG. 5, a nitride semiconductor light emitting element structure forming step S20, a first resist pattern forming step S21, a pad electrode layer forming step S22, a first resist pattern removing step S23, a protective layer forming step S24, a second resist pattern forming step S25, a protective layer etching step S26, a second resist pattern removing step S27 and a chip dividing step S28 are sequentially performed.

Each of the steps will be described below with reference to FIG. 6 and FIG. 7.

(Nitride Semiconductor Light Emitting Element Structure Forming Step: S20)

The method of manufacturing a nitride semiconductor light emitting element according to the prior art will be described starting from a nitride semiconductor light emitting element structure 110 shown in FIG. 6A.

The nitride semiconductor light emitting element structure 110 has a laminated structure obtained by laminating an n-type nitride semiconductor layer 111, an active layer 112 and a p-side nitride semiconductor layer 113 on a surface of a substrate 102 such as a sapphire substrate (hereinafter referred to as a wafer as appropriate). In the nitride semiconductor light emitting element structure 110, an n-side pad electrode connecting surface 110a as a region where the n-type nitride semiconductor layer 111 is exposed to connect an n-side pad electrode is formed (a left end in FIG. 6A), and an overall electrode 114 is formed on an upper surface of the p-side nitride semiconductor layer 113 to cover a substantially entire surface of the p-side nitride semiconductor layer 113.

In the present embodiment, an upper surface of the overall electrode 114 is a p-side pad electrode connecting surface 110b for connecting a p-side pad electrode, and a A-side pad electrode 122 (refer to FIG. 6D) is formed on a part of the p-side pad electrode connecting surface 110b. The nitride semiconductor light emitting element structure 110 can be formed in a publicly known manufacturing process.

A plurality of nitride semiconductor light emitting elements are formed on the substrate 102 in a matrix, and after being completed on the substrate 102, the nitride semiconductor light emitting elements are divided into chips. The example shown in FIG. 6 and FIG. 7 illustrates the process of manufacturing one of nitride semiconductor light emitting elements.

(First Resist Pattern Forming Step: S21)

Next, as shown in FIG. 6B, a first resist pattern 130 having openings in regions where the n-side pad electrode and the p-side pad electrode are formed is formed on the nitride semiconductor light emitting element structure 110 by photolithography.

(Pad Electrode Layer Forming Step: S22)

Next, as shown in FIG. 6C, a pad electrode layer 120 made of metal is formed on the entire surface of the wafer by sputtering or the like.

(First Resist Pattern Removing Step: S23)

Thereafter, by removing the first resist pattern, as shown in FIG. 6D, the first resist pattern 130 as well as the unnecessary pad electrode layer 120 laminated on the first resist pattern 130 are removed (lift-off) to form the n-side pad electrode 121 and the p-side pad electrode 122.

(Protective Layer Forming Step: S24)

Next, as shown in FIG. 7A, an insulating protective layer 123 made of $SiO_2$ or the like is laminated on the entire surface of the wafer by sputtering or the like.

(Second Resist Pattern Forming Step: S25)

Next, as shown in FIG. 7B, a second resist pattern 131 having openings on electrode surfaces of the n-side pad electrode 121 and the p-side pad electrode 122 is formed on the surface of the wafer.

(Protective Layer Etching Step: S26)

Next, as shown in FIG. 7C, using the second resist pattern 131 as a mask, the protective layer 123 in the openings is removed by etching to expose the electrode surfaces of the n-side pad electrode 121 and the p-side pad electrode 122.

(Second Resist Pattern Removing Step: S27)

Then, as shown in FIG. 7D, by removing the second resist pattern 131, the nitride semiconductor light emitting element is formed on the substrate (wafer) 102. As described above, in this stage, the plurality of nitride semiconductor light emitting elements are arranged on the substrate 102 in a matrix.

(Chip Dividing Step: S28)

The nitride semiconductor light emitting elements arranged on the substrate 102 in a matrix are divided into chips by dicing or the like to complete the nitride semiconductor light emitting elements in units of chips.

CONVENTIONAL TECHNICAL LITERATURE

Patent Literature

Patent document 1: JP-A-2000-174345

However, since manufacturing of the nitride semiconductor light emitting element according to the above-mentioned prior art requires a lot of steps, improvement of productivity has been demanded.

SUMMARY OF THE INVENTION

The present invention has been made in light of such problems and an object of the present invention is to provide a method of manufacturing a nitride semiconductor light emitting element, which has a small number of steps and thus, can improve productivity.

In order to achieve the above object, a method of manufacturing a nitride semiconductor light emitting element according to the present invention is a method of manufacturing a nitride semiconductor light emitting element including a nitride semiconductor light emitting element structure having an n-type nitride semiconductor layer and a p-side nitride semiconductor layer, which are laminated on a substrate, an n-side pad electrode connecting surface for connecting an n-side pad electrode to the n-type nitride semiconductor layer and a p-side pad electrode connecting surface for connecting a p-side pad electrode to the p-side nitride semiconductor layer, which are formed on the same plane side of the substrate; the n-side pad electrode connected to the n-side pad electrode connecting surface; and the p-side pad electrode connecting surface connected to the p-side pad electrode, and in the manufacturing method, a pad electrode layer forming step, a resist pattern forming step, a pad electrode layer etching step, a protective layer forming step and a resist pattern removing step are sequentially performed.

According to such procedure, first, in the pad electrode layer forming step, a pad electrode layer that becomes the n-side pad electrode and the p-side pad electrode is formed on the nitride semiconductor light emitting element structure. Next, in the resist pattern forming step, a resist pattern that coats regions where the n-side pad electrode and the p-side pad electrode are formed is formed on the pad electrode layer. Next, in the pad electrode layer etching step, using the resist pattern as a mask, the pad electrode layer is etched to form the n-side pad electrode and the p-side pad electrode. Subsequently, without removing the resist pattern, in the protective layer forming step, an insulating protective layer is formed on a surface of the nitride semiconductor light emitting element structure and the resist pattern. Then, in the resist pattern removing step, by removing the resist pattern, the resist pattern as well as the unnecessary protective layer formed on the resist pattern are removed (lift-off). In such a manner, the nitride semiconductor light emitting element is manufactured in a small number of steps.

Further, according to the method of manufacturing a nitride semiconductor light emitting element according to the present invention, wet etching is adopted in the pad electrode layer etching step, and the pad electrode layer is formed of a metal film which can be etched by the wet etching.

According to such procedure, in the pad electrode layer forming step, a metal film made of a metal material to be wet etched is formed as the pad electrode layer. Next, in the resist pattern forming step, a resist pattern that coats regions where the n-side pad electrode and the p-side pad electrode are formed is formed on the pad electrode layer. Then, in the pad electrode layer etching step, using the resist pattern as a mask, the pad electrode layer is wet etched to form the n-side pad electrode and the p-side pad electrode.

Wet etching has a higher selectivity in materials to be etched than dry etching. For this reason, by using an etching solution of selectively etching the metal film that forms the pad electrode layer, the pad electrode layer is etched while suppressing damage on an overall electrode in the nitride semiconductor light emitting element structure and the n-type nitride semiconductor layer as lower layers of the pad electrode layer.

Further, according to the method of manufacturing a nitride semiconductor light emitting element according to the present invention, the pad electrode layer is formed of a metal multi-layered film having a metal film made of Cr, Ru, Ni or Pd as a lowermost layer and a metal film made of Au as an upper layer.

According to such procedure, in the pad electrode layer forming step, the multi-layered film having the metal film made of Cr, Ru, Ni or Pd as the lowermost layer and the metal film made of Au as the upper layer is formed as the pad electrode layer. The metal film can be wet etched, and is suitably formed in close contact with the overall electrode and the n-type nitride semiconductor layer in the nitride semiconductor light emitting element structure.

Further, according to the method of manufacturing a nitride semiconductor light emitting element according to the present invention, the pad electrode layer is formed of a metal multi-layered film having a metal film made of Cr or Ru as a lowermost layer and a metal film made of Au as an upper layer.

According to such procedure, in the pad electrode layer forming step, the metal multi-layered film having the metal film made of Cr or Ru as the lowermost layer and the metal film made of Au as the upper layer is formed as the pad electrode layer. The metal film can be wet etched, and is suitably formed in close contact with the overall electrode and the n-type nitride semiconductor layer.

According to the manufacturing method of the present invention, since the number of manufacturing processes required for forming the pad electrode and the protective layer in the nitride semiconductor light emitting element can be reduced, productivity of the nitride semiconductor light emitting element can be improved.

Further, according to the manufacturing method of the present invention, since the pad electrode layer is wet etched to form the n-side pad electrode and the p-side pad electrode, the highly reliable nitride semiconductor light emitting element can be manufactured while suppressing damage on the overall electrode and the n-type nitride semiconductor layer in the lower layers of the nitride semiconductor light emitting element structure.

Further, according to the manufacturing method of the present invention, since the metal multi-layered film having the metal film made of Cr, Ru, Ni or Pd as the lowermost layer and the metal film made of Au as the upper layer is formed as the pad electrode layer, the pad electrode layer can be formed by wet etching, and the highly reliable nitride semiconductor light emitting element having a suitable adhesiveness between the pad electrode layer, and the n-type nitride semiconductor layer and the overall electrode in the nitride semiconductor light emitting element structure, and a low peeling rate of the p-side pad electrode can be manufactured.

Further, according to the present invention, since the metal multi-layered film having the metal film made of Cr or Ru as the lowermost layer and the metal film made of Au as the upper layer is used as the pad electrode, the nitride semiconductor light emitting element having an extra low peeling rate of the p-side pad electrode from the overall electrode can be manufactured.

BRIEF DESCRIPTION OF THE DRAWINGS

FIG. 3 is a schematic sectional view for describing a process of manufacturing a nitride semiconductor light emitting element in the embodiment of the present invention, in which

FIG. 4 is a schematic sectional view for describing a process of manufacturing the nitride semiconductor light emitting element in the embodiment of the present invention, which follows the manufacturing process in FIG. 3, in which

FIG. 6 is a schematic sectional view for describing a process of manufacturing a nitride semiconductor light emitting element according to the prior art, in which

FIG. 7 is a schematic sectional view for describing a process of manufacturing a nitride semiconductor light emitting element according to the prior art, which follows the manufacturing process in FIG. 6, in which

DETAILED DESCRIPTION OF THE INVENTION

A method of manufacturing a nitride semiconductor light emitting element in an embodiment of the present invention will be described below.

Embodiment

[Nitride Semiconductor Light Emitting Element]

Figure 1:
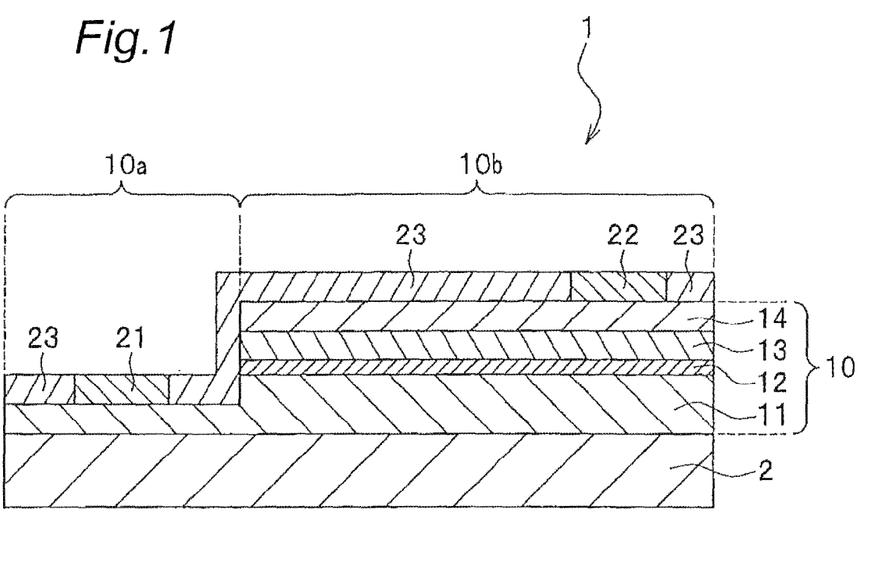
FIG. 1 is a schematic sectional view showing a configuration of a nitride semiconductor light emitting element in an embodiment of the present invention.

A structure of a nitride semiconductor light emitting element in an embodiment of the present invention will be described with reference to FIG. 1. A nitride semiconductor light emitting element 1 in the embodiment of the present invention is an LED, and as shown in FIG. 1, includes a substrate 2, a nitride semiconductor light emitting element structure 10 laminated on the substrate 2, an n-side pad electrode 21, a p-side pad electrode 22 and a protective layer 23.

In the present specification, the "nitride semiconductor light emitting element structure" refers to a laminated structure obtained by laminating an n-type nitride semiconductor layer 11, an active layer 12 and a p-side nitride semiconductor layer 13, and in the case where the nitride semiconductor light emitting element is a face-up mounted element and a translucent overall electrode 14 as a current diffusion layer is provided on the p-side nitride semiconductor layer 13, this is also contained in the nitride semiconductor light emitting element structure. In the case where the nitride semiconductor light emitting element is a flip-chip mounted element, and an overall electrode as a current diffusion layer or a reflective layer and a cover electrode for preventing migration of a material for the overall electrode are provided on the p-side nitride semiconductor layer and the n-type nitride semiconductor layer, these are also contained in the nitride semiconductor light emitting element structure. The nitride semiconductor light emitting element structure 10 further includes an n-side pad electrode connecting surface 10a for electrically connecting the n-side pad electrode 21 to the n-type nitride semiconductor layer 11 and a p-side pad electrode connecting surface 10b for electrically connecting the p-side pad electrode 22 to the p-side nitride semiconductor layer 13 on the same plane of the substrate 2. In the present specification, "upside" refers to a direction that is perpendicular to the plane of the substrate 2 on which the nitride semiconductor light emitting element structure 10 is laminated, that is a direction in which the nitride semiconductor light emitting element structure 10 is laminated. For example, the upside refers to an upward direction in FIG. 1.

(Substrate)

The substrate 2 may be made of any material that can epitaxially grow the nitride semiconductor, and there is no particular limitation on its dimension and thickness. Examples of such substrate include a sapphire or spinel ($MgAl_2O_4$) insulating substrate using a C surface, an R surface or an A surface as a principle surface, and an oxide substrates of lithium niobate or neodymium gallate lattice joined to silicon carbide (SiC), silicon, ZnS, ZnO, Si, GaAs, diamond, or nitride semiconductor.

In the case where the nitride semiconductor light emitting element 1 is a flip-chip mounted element, a back surface of the substrate 2 serves as a light extraction surface. Accordingly, in this case, since light emitted from the nitride semiconductor light emitting element 1 passes through the substrate 2 and is emitted from the light extraction surface, it is preferred that the substrate 2 has translucency to wavelength of this light. In the case where the nitride semiconductor light emitting element 1 is a face-up mounted element using the upper surface of the nitride semiconductor light emitting element 1 as the light extraction surface as in the present embodiment, a reflective layer made of Al, Ag or the like may be provided on the back surface of the substrate 2.

(Nitride Semiconductor Light Emitting Element Structure)

As described above, the nitride semiconductor light emitting element structure 10 means a laminated structure obtained by laminating the n-type nitride semiconductor layer 11, the active layer 12 and the p-side nitride semiconductor layer 13. In the present embodiment, in the nitride semiconductor light emitting element structure 10, the translucent overall electrode 14 is laminated on the p-side nitride semiconductor layer 13, and the n-side pad electrode connecting surface 10a as the upper surface of the n-type nitride semiconductor layer 11 for electrically connecting the n-side pad electrode 21 to the n-type nitride semiconductor layer 11, and the p-side pad electrode connecting surface 10b for electrically connecting the p-side pad electrode 22 to the p-side nitride semiconductor layer 13 through the overall electrode 14 are provided on the same plane of the substrate 2.

(n-Type Nitride Semiconductor Layer, Active Layer and p-Side Nitride Semiconductor Layer)

There is no particular limitation on materials for the n-type nitride semiconductor layer 11, the active layer 12 and the p-side nitride semiconductor layer 13, and the materials may be preferably gallium nitride-based semiconductor such as $In_XAl_YGa_{1-X-Y}N$ ($0 \leq X$, $0 \leq Y$, $X+Y<1$). The n-type nitride semiconductor layer 11, the active layer 12 and the p-side nitride semiconductor layer 13 (collectively referred to as nitride semiconductor layers 11, 12, 13 as appropriate) each have a monolayered structure or a laminated structure or a superlattice structure that includes different layers in composition and thickness. It is preferred that especially the active layer 12 as a light-emitting layer has a single quantum well structure or a multiple quantum well structure that is obtained by laminating thin films causing a quantum effect, and a well layer is made of nitride semiconductor containing In. The n-type nitride semiconductor layer 11 may be formed above the substrate 2 through a foundation layer (not shown) such as a buffer layer that mitigates mismatch with the substrate 2 in lattice constant.

Usually, there is no particular limitation on such nitride semiconductor layers 11, 12, 13 each may have a homostructure, a heterostructure or a double-heterostructure with MIS bonding, PIN bonding or PN bonding, and its thickness, and the thickness may be variously set. Examples of the laminated structure of the nitride semiconductor layers include a buffer layer made of AlGaN, an undoped GaN layer, a n-side contact layer made of Si-doped n-type GaN, a superlattice layer in which a GaN layer and an InGaN layer are alternately laminated, an active layer having a multiple quantum well structure in which a GaN layer and an InGaN layer are alternately laminated, a superlattice layer in which an Mg-doped AlGaN layer and an Mg-doped InGaN layer are alternately laminated, and a p-side contact layer made of Mg-doped GaN.

In the present invention, there is no particular limitation on the method of forming a nitride semiconductor layers, and it is possible to preferably use publicly-known methods of growing the nitride semiconductor, including MOVPE (Metalorganic Vapor Phase Epitaxy), MOCVD (Metal Organic Chemical Vapor Deposition), HVPE (Hydride Vapor Phase Epitaxy) and MBE (Molecular Beam Epitaxy). Especially, MOCVD is preferable as it can grow the semiconductor with satisfactory crystallinity. Further, it is preferred that the growing methods of the nitride semiconductors 11, 12 and 13 are appropriately selected according to intended uses.

(Overall Electrode)

The overall electrode 14 is provided on the p-side nitride semiconductor layer 13 so as to cover the substantially entire surface of the p-side nitride semiconductor layer 13, and functions as an electrode that uniformly diffuse a current supplied via the p-side pad electrode 22 to the entire surface of the p-side nitride semiconductor layer 13. In the present embodiment, since the upper surface of the overall electrode 14 on the side of the p-side nitride semiconductor layer 13 is a light extraction surface, the overall electrode 14 is a translucent electrode having translucency to the wavelength of the light emitted from the active layer 12.

The translucent overall electrode 14 may be formed of inducting oxide such as ITO (Indium Tin Oxide), IZO (Indium Zinc Oxide), ZnO, $In_2O_3$ and $SnO_2$ or a metal thin film. In order to uniformly supply the current to the entire range of the p-side nitride semiconductor layer 13 having a relatively high resistance, it is preferred that the overall electrode 14 is formed on a large area, that is, a substantially entire surface of the p-side nitride semiconductor layer 13. There is no particular limitation on the thickness of the overall electrode 14, and the thickness is preferably set to 5,000 nm or less, more preferably about 100 to 1,000 nm, so as not to cause an excessive large sheet resistance.

The overall electrode 14 may be formed by sputtering, vacuum vapor deposition, chemical vapor deposition (CVD) or the like of the above-mentioned material.

(n-Side Pad Electrode and p-Side Pad Electrode)

The n-side pad electrode 21 and the p-side pad electrode 22 are pad electrodes connected to an external power source by wire bonding or the like. The n-side pad electrode 21 is electrically connected to the n-type nitride semiconductor layer 11, and the p-side pad electrode 22 is electrically connected to the p-side nitride semiconductor layer 13 via the overall electrode 14 to supply a current to the nitride semiconductor light emitting element 1 from the outside. The n-side pad electrode 21 is provided in the n-side pad electrode connecting surface 10a as the upper surface of the n-type nitride semiconductor layer 11 in the nitride semiconductor light emitting element structure 10. The p-side pad electrode 22 is provided in the p-side pad electrode connecting surface 10b as the upper surface of the overall electrode 14 in the nitride semiconductor light emitting element structure 10.

The n-side pad electrode 21 and the p-side pad electrode 22 are preferably made of a material having a low electrical resistance, and can be formed of a monolayered film made of metal or alloy or a multilayered film made of metal or alloy.

The n-side pad electrode 21 and the p-side pad electrode 22 are formed by etching a pad electrode layer 20 (refer to FIG. 3C and FIG. 4A) in a below-mentioned pad electrode layer etching step S13 of the manufacturing method (refer to FIG. 2). At this time, in order to suppress damage on the overall electrode 14 and the n-type nitride semiconductor layer 11, which are made of ITO or the like and are located in the lower layers of the pad electrode layer 20 (refer to FIG. 3C and FIG. 4A), etching is preferably, wet etching. Net etching has a higher selectivity in the material to be etched than dry etching and thus, can reduce damage on the overall electrode 14 and the n-type nitride semiconductor layer 11, which are made of ITO or the like and are located in the lower layers of the pad electrode layer 20 (refer to FIG. 3C and FIG. 4A). Accordingly, the material for the n-side pad electrode 21 and the p-side pad electrode 22 is preferably, a material that can be removed (etched) by wet etching. Further, it is desired that the material for the n-side pad electrode 21 and the p-side pad electrode 22 has a high adhesiveness and a low contact resistance between the n-type nitride semiconductor layer 11 and the overall electrode 14 as lower layers. It is especially desired that adhesiveness between the p-side pad electrode 22 and the overall electrode 14 is high, and the peeling rate of the p-side pad electrode 22 is low. Examples of the material that can be wet etched and satisfy the above-mentioned condition include a metal multi-layered film made of Cr/Au, Ru/Au, Ni/Au, Pd/Au or Cr/Ru/Au (lowermost layer at the left end). Among them, the Cr/Au multilayered film or the Ru/Au multilayered film that has a low peeling rate of the p-side pad electrode 22 is especially preferable.

The total thickness of the n-side pad electrode 21 and the p-side pad electrode 22 is preferably, about 100 to 10000 nm. In the case of the above-mentioned multi-layered film including the metal film made of Cr, Ru, Ni, Pd or the like as the lower layer, the thickness of the metal film in the lower layer is preferably, about 1 to 100 nm and more preferably, 1 to 10 nm.

The n-side pad electrode 21 and the p-side pad electrode 22 each may have any shape such as a rectangle, polygon, circle and ellipse in a plan view.

(Protective Layer)

The protective layer 23 is an insulating coating film that coats exposed surfaces (an upper surface and a side surface) of the nitride semiconductor light emitting element structure 10, and functions as a protective and antistatic film for the nitride semiconductor light emitting element 1. The protective layer 23 can be made of an oxide of insulating Si, Ti, Ta or the like, and can be formed by vapor deposition, sputtering or the like. The protective layer 23 has preferably a thickness of 100 nm or more, and may be made of, for example, $SiO_2$ having a thickness of about 3,500 nm. The protective layer 23 coats the upper surface of the overall electrode 14, but does not coat upper surfaces of the n-side pad electrode 21 and the p-side pad electrode 22. When the upper surface of the protective layer 23 on the side of the p-side nitride semiconductor layer 13 is a light extraction surface, it is preferred that the protective layer 23 has translucency to the wavelength of light emitted from the active layer 12.

[Operations of Nitride Semiconductor Light Emitting Element]

In the nitride semiconductor light emitting element 1 in the embodiment of the present invention shown in FIG. 1, when a current is supplied from an external power source via the wire bonded n-side pad electrode 21 and p-side pad electrode 22, the active layer 12 in the nitride semiconductor light emitting element structure 10 emits light. The light emitted from the active layer 12 is extracted through the translucent overall electrode 14 and the protective layer 23, which are provided on the upper surface of the nitride semiconductor light emitting element structure 10, and the back surface of the substrate 2, or from the side surface of the nitride semiconductor light emitting element structure 10. When the reflective layer is provided on the bottom surface of the substrate 2, light that advances in the direction of the back surface is reflected upward and extracted through the overall electrode 14 and the protective layer 23.

[Method of Manufacturing Nitride Semiconductor Light Emitting Element]

A method of manufacturing a nitride semiconductor light emitting element in the embodiment of the present invention will be described with reference to the accompanying drawings.

Figure 2:
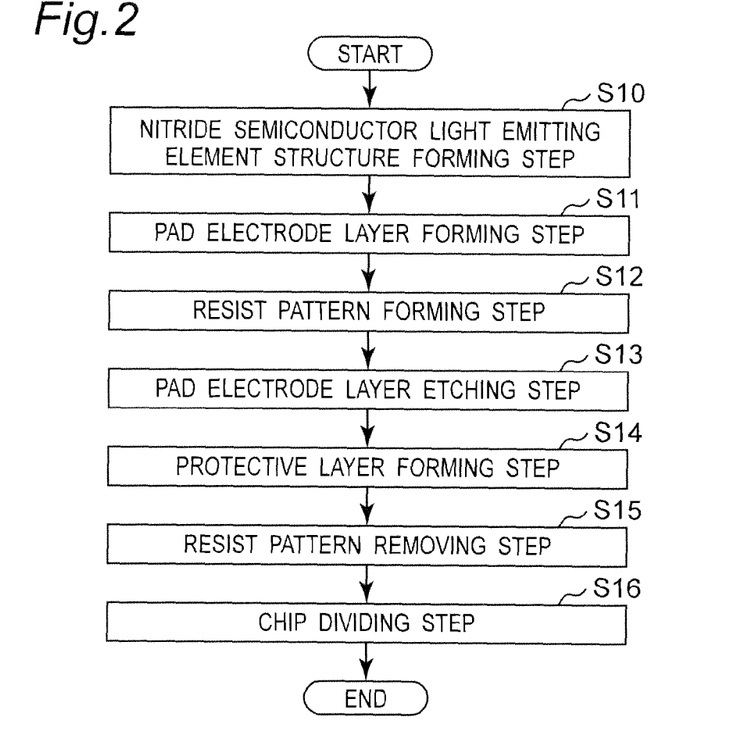
FIG. 2 is a flow chart showing a flow of a method of manufacturing a nitride semiconductor light emitting element in an embodiment of the present invention.

As shown in FIG. 2, according to the method of manufacturing a nitride semiconductor light emitting element in the present embodiment, a nitride semiconductor light emitting element structure forming step S10, a pad electrode layer forming step S11, a resist pattern forming step S12, a pad electrode layer etching step S13, a protective layer forming step S14, a resist pattern removing step S15 and a chip dividing step S16 are sequentially performed.

Each of the steps will be described below in detail with reference to FIG. 3 and FIG. 4 (refer to FIG. 1 and FIG. 2 as appropriate).

(Nitride Semiconductor Light Emitting Element Structure Forming Step: S10)

Figure 3A:
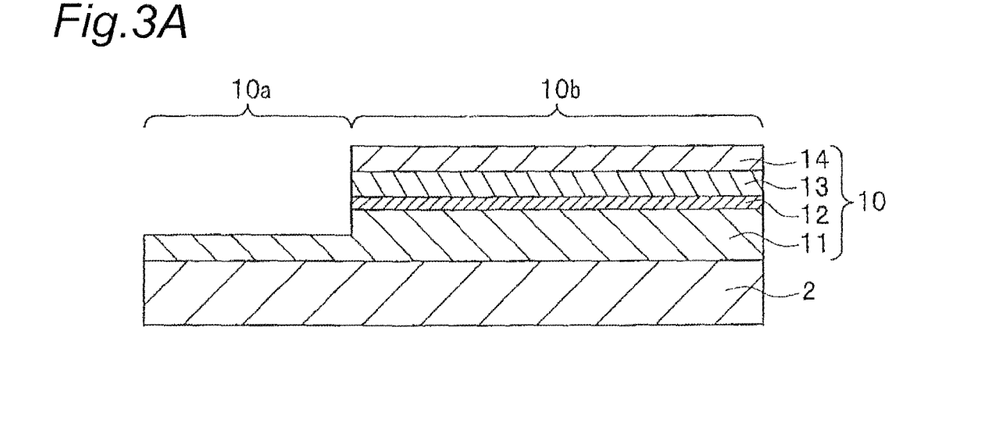
FIG. 3A shows a state where a nitride semiconductor light emitting element structure is formed.

First, the nitride semiconductor light emitting element structure 10 shown in FIG. 3A is formed on the translucent substrate 2 made of sapphire or the like by a publicly known manufacturing method.

Briefly describing a process of forming the nitride semiconductor light emitting element structure 10, first, the nitride semiconductor constituting each of the n-type nitride semiconductor layer 11, the active layer 12 and the p-side nitride semiconductor layer 13 is grown on the translucent substrate 2 made of sapphire or the like using MOVPE method. Then, it is preferred that the substrate 2 (hereinafter referred to as wafer) on which each nitride semiconductor layer is grown is subjected to annealing under a nitrogen atmosphere at about 600 to 700° C. to allow the p-side nitride semiconductor layer 13 to have a low resistance.

Next, as the n-side pad electrode connecting surface 10a for connecting the n-side pad electrode 21, a part of the n-type nitride semiconductor layer 11 is exposed. A mask of predetermined shape is formed on the annealed wafer by photoresist, and the p-side nitride semiconductor layer 13 and the active layer 12 and a part of the n-type nitride semiconductor layer 11 are removed by reactive ion etching (RIE) to expose the n-type nitride semiconductor layer 11. After etching, the resist is removed. In the present embodiment, the exposed surface of the n-type nitride semiconductor layer 11 would serve as the n-side pad electrode connecting surface 10a.

Next, for example, ITO or IZO as the overall electrode 14 is formed on the entire surface of the wafer by sputtering or the like. Then, the overall electrode 14 of predetermined shape is formed by photolithography. In the present embodiment, the upper surface of the overall electrode 14 of predetermined shape becomes the p-side pad electrode connecting surface 10b.

The nitride semiconductor light emitting element structure 10 is formed in such a manner.

The plurality of nitride semiconductor light emitting element structures 10 are formed on the substrate 2 in a matrix, and the nitride semiconductor light emitting elements 1 are completed on the substrate 2 and then divided into chips.

(Pad Electrode Layer Forming Step: S11)

Next, as shown in FIG. 3A, a multilayered film such as Cr/Au, Ru/Au, Ni/Au, Pd/Au or Cr/Ru/Au (lowermost layer at the left end) is laminated on the entire surface of the wafer by sputtering or the like to form the pad electrode layer 20. In the case where wet etching is used in the pad electrode layer etching step S13 as the subsequent step, it is required to remove (etch) a material for the pad electrode layer 20 by wet etching.

According to the prior art, as shown in FIG. 6B to FIG. 6D, when the pad electrode layer 120 is formed in order to form the first resist pattern 130 on the overall electrode 114 and the n-type nitride semiconductor layer 111, the mounting surface of the n-side pad electrode 121 and the p-side pad electrode 122 may be contaminated with a resist material or a washing solution, thereby degrading adhesiveness and contact resistance between the n-side pad electrode 121 and the n-type nitride semiconductor layer 111, and between the p-side pad electrode 122 and the overall electrode 114. On the contrary, in the present embodiment, since the pad electrode layer 20 is laminated immediately after lamination of the overall electrode 14, such degradation can be prevented.

(Resist Pattern Forming Step: S12)

Figure 3B:
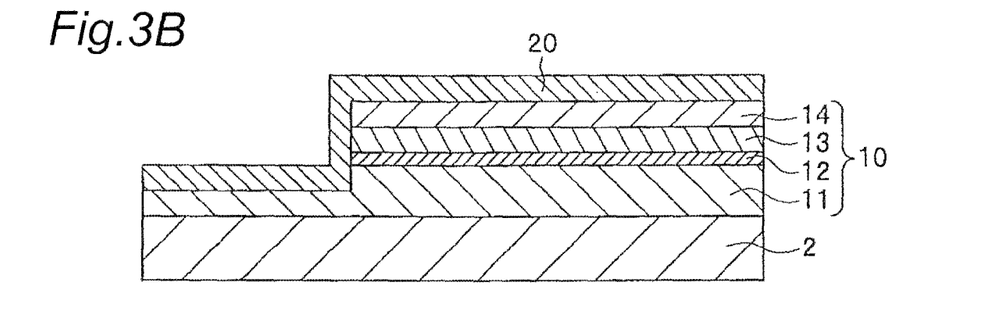
FIG. 3B shows a state where a pad electrode layer is formed and FIG. 3C shows a state where a resist pattern for forming a pad electrode is formed.
Figure 3C:
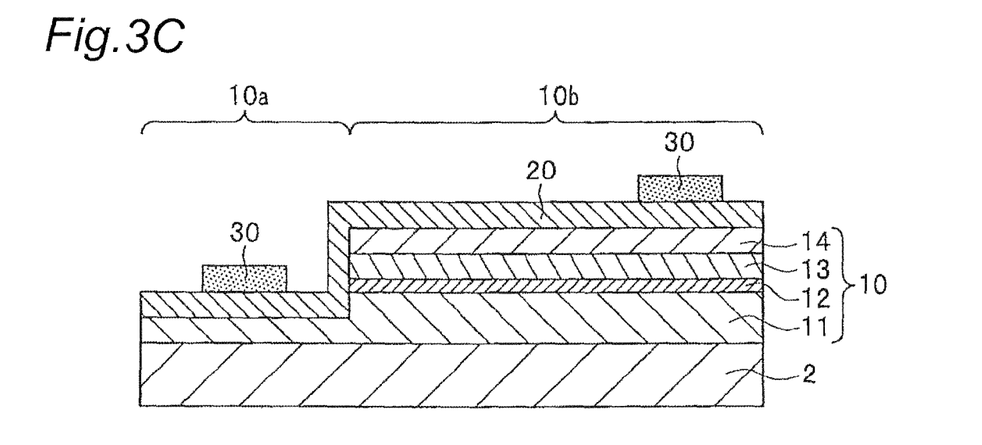

Next, as shown in FIG. 3C, a resist pattern 30 that masks a region where the n-side pad electrode 21 is formed and a region where the p-side pad electrode 22 is formed is formed by photolithography. The resist pattern 30 serves as a mask for etching in the next pad electrode layer etching step S13. In the case of wet etching, for example, a novolac resin-based resist material can be used. Specific examples include a product name AZ5218-E manufactured by AZ Electronic Materials (ingredients: propylene glycol monomethyl ether acetate of 70% by weight, novolac resin derivative, naphthoquinone diazide), a product name AZ5200NJ-85cp manufactured by AZ Electronic Materials (ingredients: propylene glycol monomethyl ether acetate of 60% by weight, novolac resin derivative, naphthoquinone diazide), and a product name OFPR-8600 manufactured by TOKYO OHKA KOGYO CO. LTD (ingredient: ethyl cellosolve acetate of 95 to 45% by weight, novolac resin derivative of 40 to 5% by weight, sensitizer of 15 to 1% by weight).

(Pad Electrode Layer Etching Step: S13)

Figure 4A:
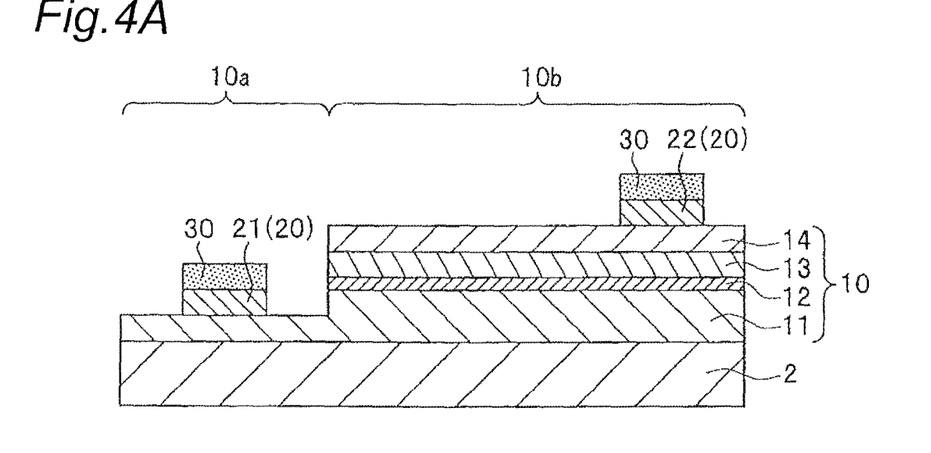
FIG. 4A shows a state where the pad electrode is formed.

Next, as shown in FIG. 4A, using the resist pattern 30 as a mask, the pad electrode layer 20 is etched. Thereby, the pad electrode layer 20 is removed while leaving the region where the n-side pad electrode 21 is formed and the region where the p-side pad electrode 22 is formed, which are masked with the resist pattern 30.

Here, although the pad electrode layer 20 can be dry etched, it is preferred to use wet etching having higher selectivity in the material to be etched than dry etching. By adopting wet etching, the pad electrode layer 20 made of metal can be etched, and damage on the overall electrode 14 and the n-type nitride semiconductor layer 11 that are made of ITO and located in the lower layers can be suppressed.

Moreover, by adopting wet etching, etching can be performed at high speed with a simple manufacturing apparatus without requiring a vacuum device as used in dry etching.

In the case of adopting wet etching, for etching solution that etches the pad electrode layer 20, a diluted solution of a mixture of iodine, potassium iodide and nitrogen-based organic compound for Au, a diluted solution of a mixture of ceric ammonium nitrate and perchloric acid or a diluted solution for Cr, Ru, and an acetic acid solution containing $FeCl_3$ for Ni, Pd can be used.

(Protective Layer Forming Step: S14)

Figure 4B:
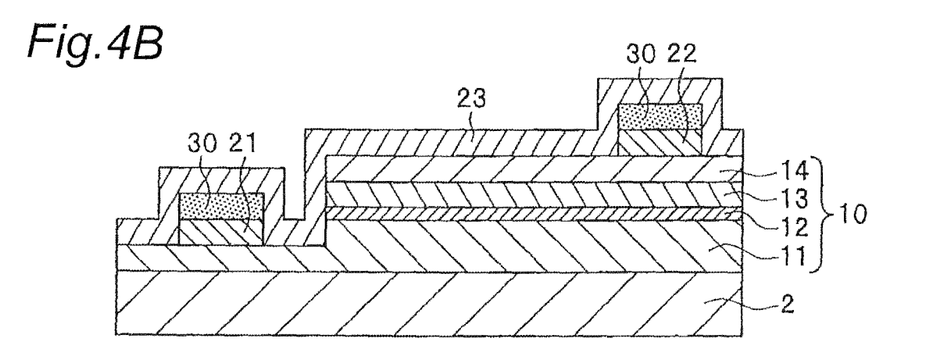
FIG. 4B shows a state where a protective layer is formed and FIG. 4C shows a state where the resist pattern is removed.

Next, as shown in FIG. 4B, without removing the resist pattern 30, insulating $SiO_2$ or the like is laminated on the entire surface of the wafer, for example, by sputtering to form the protective layer 23.

(Resist Pattern Removing Step: S15)

Figure 4C:
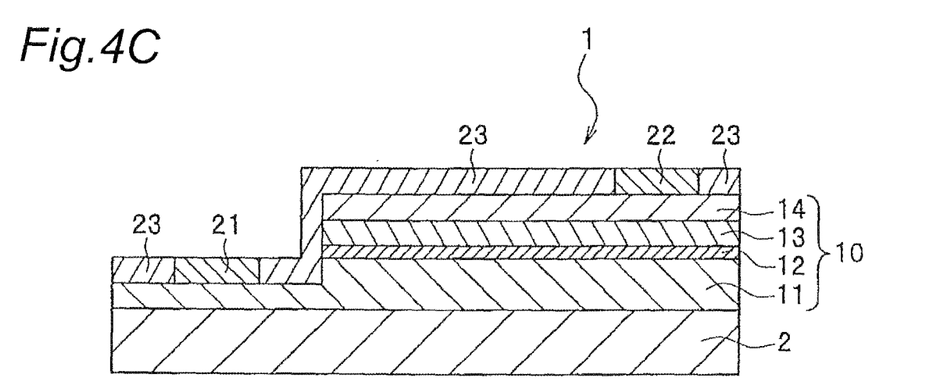

Then, as shown in FIG. 4C, by removing the resist pattern 30 by use of a resist film peeling solution, the protective layer 23 formed on an upper surface of the resist pattern 30 together with the resist pattern 30 is removed (lift-off). Thereby, the electrode surfaces as the upper surfaces of the n-side pad electrode 21 and the p-side pad electrode 22 are exposed. In such a manner, the plurality of nitride semiconductor light emitting elements 1 arranged in a matrix are formed on the substrate (wafer) 2.

According to the manufacturing method of the present invention, since the n-side pad electrode 21, the p-side pad electrode 22 and the protective layer 23 are patterned by using the resist pattern 30 formed in one step (resist pattern forming step S12), the number of steps can be reduced.

According to the manufacturing method of the present invention, since the protective layer 23 is laminated without removing the resist pattern 30 used for forming the n-side pad electrode 21 and the p-side pad electrode 22, after removal of the resist pattern 30, the upper surfaces of the n-side pad electrode 21 and the p-side pad electrode 22 are exposed without being coated with the protective layer 23. For this reason, the whole of the upper surfaces of the n-side pad electrode 21 and the p-side pad electrode 22 can be used as a wire connecting surface in wire bonding. Accordingly, the n-side pad electrode 21 and the p-side pad electrode 22 in a plan view can be shaped so as to have a minimum required dimension. As a result, the area of the n-side pad electrode connecting surface 10a can be reduced, while the area of the active layer 12 and the p-side nitride semiconductor layer 13, which contributes to light emission, can be increased, thereby increasing the amount of emitted light. When the upper surface side of the nitride semiconductor light emitting element 1 is the light extraction surface, since the area of the p-side pad electrode 22 in a plan view, which interrupts light extraction, can be reduced, the light extraction efficiency of the nitride semiconductor light emitting element 1 can be improved.

(Chip Dividing Step: S16)

By dividing the plurality of nitride semiconductor light emitting elements 1 arranged on the substrate (wafer) 2 in a matrix into chips by scribing, dicing or the like, the nitride semiconductor light emitting elements 1 in units of chips are completed. Before division into chips, the nitride semiconductor light emitting elements may be made thinner by polishing (back grinding) the substrate 2 from the back surface of the substrate 2 so as to have a thickness of about 85 μm, for example.

In the pad electrode layer forming step S11 or the subsequent steps, the wafer may be subjected to heat treatment at about 200 to 400° C. according to the material for the pad electrode layer 20. This can improve adhesiveness between the n-side pad electrode 21 and the n-type nitride semiconductor layer 11 and between the p-side pad electrode 22 and the overall electrode 14, thereby decreasing the contact resistance therebetween or reducing the peeling rate.

As described above, according to the method of manufacturing a nitride semiconductor light emitting element in the embodiment of the present invention, the manufacturing process can be shortened, thereby improving productivity of the nitride semiconductor light emitting element.

While the nitride semiconductor light emitting element and its manufacturing method according to the present invention have been described based on the embodiment of the present invention, the present invention is not limited to the above-mentioned embodiment, and various changes and modifications based on the description fall within the scope of the present invention.

EXAMPLES

An Example in which the nitride semiconductor light emitting element was manufactured and the effect of the structure of the pad electrode of the present invention was confirmed will be described. However, the present invention is not limited to this Example.

According to the manufacturing method shown in FIG. 2 to FIG. 4, the nitride semiconductor light emitting element 1 having the structure shown in FIG. 1 was manufactured. Briefly describing the operating example of the method of manufacturing a nitride semiconductor light emitting element 1, the n-type nitride semiconductor layer 11 made of n-type GaN (gallium nitride), the active layer 12 and the p-side nitride semiconductor layer 13 made of p-type GaN were laminated on the sapphire substrate 2 by MOCVD, a part of the p-side nitride semiconductor layer 13 was etched from its surface, thereby exposing the n-type nitride semiconductor layer 11 to form the n-side pad electrode connecting surface 10a. Then, the translucent overall electrode 14 made of ITO was laminated on the p-side nitride semiconductor layer 13 that became the light extraction surface by sputtering. Next, after the pad electrode layer 20 was laminated by sputtering, the resist pattern 30 is formed of a novolac resin-based resist material. Next, the pad electrode layer 20 was etched by wet etching using a diluted solution of a mixture of iodine, potassium iodide and nitrogen-based organic compound for Au, a diluted solution of a mixture of ceric ammonium nitrate and perchloric acid for Cr, Ru, and an acetic acid solution containing $FeCl_3$ for Ni, Pd, as etching solutions, to form the circular n-side pad electrode 21 and p-side pad electrode 22 in a plan view on the n-side pad electrode connecting surface 10a and the overall electrode, respectively. Next, without removing the resist pattern 30, the protective layer 23 made of $SiO_2$ was formed on the surface of the wafer by sputtering and then, the resist pattern 30 was removed to form the nitride semiconductor light emitting element 1 on the wafer.

Table 1 shows results of a wire bonding peeling acceleration test in the operating example in which the pad electrode layer 20 of the nitride semiconductor light emitting element 1, which is made of a material described in a column "pad structure" in Table 1 so as to a thickness described in a column "thickness", is connected to the p-side pad electrode 22 with an Au wire. Samples No. 1 to 5 show a case where heat treatment is not performed after lamination of the pad electrode layer 20, and samples No. 6 to 10 shows a case where heat treatment is performed under 280° C. in an N2 atmosphere for 30 minutes. The samples No. 5 and No. 10 shows test results in reference examples in which the nitride semiconductor light emitting element having an Au monolayered film as the pad electrode layer 20, in order to confirm the effect of the case where a metal film of Cr or Ru is provided in the lower layer of the pad electrode layer 20.

TABLE 1

| No. | Pad structure | Thickness (nm) | Heat treatment | Peeling rate |
|---|---|---|---|---|
| 1 | Cr/Au | 3/500 | Not performed | 0.0% |
| 2 | Ru/Au | 3/500 |  | 0.0% |
| 3 | Ni/Au | 2/500 |  | 2.0% |
| 4 | Pd/Au | 3/500 |  | 0.1% |
| 5 | Au | 500 |  | 100.0% |
| 6 | Cr/Au | 3/500 | Performed | 0.0% |
| 7 | Ru/Au | 3/500 | (280° C.) | 0.0% |
| 8 | Ni/Au | 2/500 |  | 9.6% |
| 9 | Pd/Au | 3/500 |  | 57.4% |
| 10 | Au | 500 |  | 100.0% |

As shown in Table 1, in the samples No. 1 to No. 4 with no heat treatment provide satisfactory results with respect to the peeling rate of the p-side pad electrode 22. The samples No. 1 and No. 2 in which the metal film made of Cr or Ru is provided in the lower layer provide especially satisfactory results. As is apparent from the results, the samples in which the metal film made of Cr, Ru, Ni or Pd is provided in the lower layer can further reduce the peeling rate, as compared to the sample No. 5 in which the pad electrode layer 20 is made of only Au.

The samples No. 6 to No. 9 subjected to heat treatment, in which the metal film made of Cr, Ru, Ni or Pd is provided in the lower layer, also can further reduce the peeling rate, as compared to the sample No. 10 as the reference example, in which the pad electrode layer 20 is made of only Au. Here, especially in the case where the metal film made of Pd is provided in the lower layer, the peeling rate increases. Also in this case, however, the sample can be used by omitting heat treatment. That is, by appropriately selecting presence/absence of heat treatment and its conditions according to the material for the pad electrode layer 20, more various materials can be adopted.

Although the lower peeling rate of the p-side pad electrode 22 is more preferable in Table 1, since this test is the acceleration test, the sample can be adopted unless the peeling rate is 0%.

This application claims the benefit of Japanese Application No. 2011-112625 filed on May 19, 2011 including the specification, drawings, claims and abstract, which are fully incorporated herein by reference.

What is claimed is:

1. A manufacturing method of a flip-chip nitride semiconductor light emitting element including: a nitride semiconductor light emitting element structure having an n-type nitride semiconductor layer and a p-type nitride semiconductor layer, which are laminated on a substrate, and an n-side electrode connecting surface of the n-type nitride semiconductor layer and a p-side electrode connecting surface of the p-type nitride semiconductor layer, the n-side electrode connecting surface and the p-side electrode connecting surface being formed on the same plane side of the substrate, an n-side electrode being connected to the n-side electrode connecting surface and a p-side electrode being connected to the p-side electrode connecting surface, the method comprising sequential steps of:
 a pad electrode layer forming step of forming a pad electrode layer that becomes the n-side pad electrode and the p-side pad electrode on the nitride semiconductor light emitting element structure;
 a resist pattern forming step of forming a resist pattern that coats regions where the n-side pad electrode and the p-side pad electrode are formed on the pad electrode layer;
 a pad electrode layer etching step of etching the pad electrode layer using the resist pattern as a mask to form the n-side pad electrode and the p-side pad electrode;
 a protective layer forming step of forming an insulating protective layer on a surface of the nitride semiconductor light emitting element structure and the resist pattern without removing the resist pattern; and
 a resist pattern removing step of removing the resist pattern.

2. The manufacturing method of a flip-chip nitride semiconductor light emitting element according to claim 1, wherein a wet etching method is adopted in the pad electrode layer etching step.

3. The manufacturing method of a flip-chip nitride semiconductor light emitting element according to claim 2, wherein a multi-layered film having a metal film made of one selected from a group consisting of Cr, Ru, Ni and Pd as a lowermost layer and a metal film made of Au as an upper layer is formed as the pad electrode layer in the pad electrode layer forming step.

4. The manufacturing method of a flip-chip nitride semiconductor light emitting element according to claim 2, wherein a multi-layered film having a metal film made of one selected from a group consisting of Cr and Ru as a lowermost layer and a metal film made of Au as an upper layer is formed as the pad electrode layer in the pad electrode layer forming step.

* * * * *